US008724671B2

(12) United States Patent
Moore

(10) Patent No.: US 8,724,671 B2
(45) Date of Patent: May 13, 2014

(54) MULTIPLE WAVELENGTH LASER SYSTEM

(71) Applicant: Southwest Research Institute, San Antonio, TX (US)

(72) Inventor: Thomas Z. Moore, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 0 days.

(21) Appl. No.: 13/749,286

(22) Filed: Jan. 24, 2013

(65) Prior Publication Data

US 2013/0195128 A1  Aug. 1, 2013

Related U.S. Application Data

(60) Provisional application No. 61/590,217, filed on Jan. 24, 2012.

(51) Int. Cl.
H01S 3/083  (2006.01)

(52) U.S. Cl.
USPC .......... 372/94; 372/12; 372/21; 372/70; 372/97

(58) Field of Classification Search
USPC .......................................................... 372/94
See application file for complete search history.

(56) References Cited

U.S. PATENT DOCUMENTS

| 4,914,658 | A * | 4/1990 | Stankov et al. | 372/18 |
| 4,972,425 | A * | 11/1990 | Braski | 372/32 |
| 7,542,489 | B2 * | 6/2009 | Luo et al. | 372/18 |
| 2003/0099262 | A1 * | 5/2003 | Masuda | 372/21 |

OTHER PUBLICATIONS

Anderson, et al; "In-Situ LDRIMS Geochronometry for the Moon and Mars"; 40th Lunar and Planetary Science Conference (2009); LPI Contribution No. 1468, (pp. 2290).
Depenheuer, et al; "A Pulsed Laser System With Large Spectral Coverage Extended by Non-linear Frequency Conversion"; Applied Physics B, Lasers and Optics (2009) 97: pp. 583-589.
Gizbrekht, et al; "Two-wave Emission From an Al2O3:Ti Crystal Laser"; Soy. J. Quantum Electron vol. 19, No. 10 (1989) pp. 13051307; © 1990 American Institute of Physics.
Hamilton; "Single-frequency, Injection-seeded Ti:sapphire Ring Laser With High Temporal Precision"; Optical Society of America; Optical Letters, vol. 17, No. 10 (1992) pp. 728-730.
Henderson, et al; "Fast Resonance-Detection Technique for Single-Frequency Operation of Injection-Seeded Nd: YAG Lasers"; (1986) Optical Society of America, vol. 11, No. 11, Optics Letters, pp. 715-717.

(Continued)

Primary Examiner — Xinning Niu
(74) Attorney, Agent, or Firm — Grossman, Tucker et al

(57) ABSTRACT

A system for generating multiple simultaneous laser wavelengths, said system comprising: a pulsed slave laser comprising a non-linear electro-optic crystal optically coupled to a lasing crystal in a ring cavity configuration, said non-linear electro-optic crystal configured to adjust an optical path length of said ring cavity in response to an applied voltage potential; an energy pump configured to initiate a pulse cycle in said pulsed slave laser in response to a trigger; a cavity control circuit configured to apply said voltage potential to said non-linear electro-optic crystal to generate a cavity resonance condition associated with said adjusted optical path length, said cavity control circuit further configured to provide said trigger to said energy pump in response to a detection of said cavity resonance condition; and one or more seed lasers configured to inject a single frequency laser beam into said pulsed slave laser.

17 Claims, 7 Drawing Sheets

(56) References Cited

OTHER PUBLICATIONS

Kasapi, et al; "Pulsed Ti:sapphire Laser Seeded Off the Gain Peak"; (1196) Optical Society of America, vol. 35, No. 12, Applied Optics pp. 1999-2004.

Katsuragawa, et al; "Dual-wavelength Injection-locked Pulsed Laser"; Optics Letters, vol. 30, No. 18, Sep. 15, 2005, pp. 2421-2423.

Lacovara, et al; "Flash-lamp-pumped Ti:Al2O3 Laser Using Fluorescent Conversion"; Optics Letters, vol. 10, No. 6, Jun. 1985, pp. 273-275.

Measures; "Laser Remote Chemical Analysis"; Second Edition, A Wiley-Interscience Publication, John Wiley & Sons, Inc. (1988) (cover page, copyright info and table of contents provided).

Moulton; "An Investigation of the Co:MgF2 Laser System"; IEEE Journal of Quantum Electronics, vol. QE-21. No. 10, Oct. 1985, pp. 1582-1595.

Moulton; "Spectroscopic and Laser Characteristics of Ti:Al2O3"; Optical Society of America, Solid-State Laser Materials, vol. 3, No. 1, Jan. 1986, J. Opt. Soc. Am. B, pp. 125-133.

Moulton; "Ti-doped Sapphire: Tunable Solid-state Laser"; Optics News; Nov./Dec. 1982.

Onose, et al; "Dual-wavelength Injection-locked Pulsed Laser With Highly Predictable Performance"; Optics Express, vol. 15, No. 4, Feb. 19, 2007, pp. 1600-1605.

Ping-Xue, et al; "Oscillation Conditions of CW Simultaneous Dual-wavelength Nd:YAG Laser for Transitions 4F3/2-4I9/2 and 4F312-4I11/2"; Chinese Physics Society and IOP Publishing Ltd, (2004) Chinese Physics vol. 13, No. 10, pp. 1689-1693.

Pinto; "Improved Ti:Sapphire Laser Performance With New High Figure of Merit Crystals"; IEEE Journal of Quantum Electronics, vol. 30, No. 11, Nov. 1994, pp. 2612-2616.

Sanchez, et al; "Room-temperature Continuous-wave Operation of a Ti:Al2O3 Laser"; Optical Society of America, Optics Letters, vol. 11, No. 6, Jun. 1986, pp. 363-364.

Schmitt, et al; "Diode-laser-pumped Nd:YAG Laser Injection Seeding System"; Applied Optics, (1986) vol. 25, No. 5, pp. 629-633.

Sokolov, et al; "Raman Generation by Phased and Antiphased Molecular States"; The American Physical Society—Physical Review Letters; (2000); vol. 85, No. 3, pp. 562-565.

Tian, et al; "Synchronous, Dual-wavelength, Injection-seeded Amplification of 5-ns. Pulses in a Flash-lamp-pumped Ti:sapphire Lase"; Optics Letters, vol. 24, No. 21, Nov. 1, 1999, pp. 1496-1498.

Walther, et al; "Generation of Fourier-Transform-Limited 35-ns Pulses With a Ramp-hold-fire Seeding Technique in a Ti:sapphire Laser"; (2001) Optical Society of America, Applied Optics, vol. 40, No. 18, pp. 3046-3050.

Xin, et al; "An All-solid-state High Power Quasi-continuous-wave Tunable Dual-wavelegth Ti:sapphire Laser System Using Birefringence Filter"; Chinese Physics Society and IOP Publishing Ltd, (2007) Chinese Physics vol. 16, No. 7, pp. 1991-1995.

\* cited by examiner

Co-propagating Dual Wavelength Injection Seeded Ti:sapphire Ring Laser

MULTIPLE WAVELENGTH LASER SYSTEM

CROSS REFERENCE TO RELATED APPLICATIONS

The present application claims the benefit of the filing date of U.S. Provisional Application Ser. No. 61/590,217, filed Jan. 24, 2012, the teachings of which are incorporated herein by reference.

FIELD OF THE INVENTION

The present invention relates to a multiple wavelength laser system. More specifically, the laser system may produce simultaneous multiple discrete wavelengths on each output pulse, where each discrete wavelength and each output pulse is Fourier-transform limited.

BACKGROUND

There exist numerous applications that require the delivery of multiple simultaneous laser wavelengths. These include, for example, differential absorption lidar (DIAL), non-linear frequency mixing, pump-probe detection, and laser resonance ionization. Typically, multiple laser systems are needed to generate these different wavelengths, but there are problems with this approach including timing jitter issues and the burden of maintaining multiple laser systems. In addition, many applications require the laser to operate in uncontrolled and noisy environments that can adversely affect the performance of the lasers. What is needed, therefore, is a tunable laser system with the capability to produce two or more discrete wavelengths of light simultaneously and with the capability to generate Fourier-transform limited pulsed laser output on every pulse in an uncontrolled and noisy environment.

SUMMARY

A laser system in accordance with embodiments of the present disclosure may produce Fourier-transform limited (i.e., minimum possible spectral width for a given pulse duration) laser pulsed output for multiple discrete wavelengths simultaneously. The laser may develop from one to four, or more, discrete wavelengths of light, preferably within the Near Infrared (NIR) wavelength range of the spectrum and may be dynamically tuned continuously during laser operation. In addition, the laser may employ a ramp-hold-fire technique for mode-matching a seed laser output to a slave amplifier cavity, resulting in laser output from the slave amplifier cavity which has improved immunity to mechanical noise throughout the acoustic range.

Embodiments of the disclosure employ an injection-seeded Ti:Sapphire ring laser with the capability to utilize both co- and counter-propagating seed beams and improved active cavity control response time to improve the noise immunity throughout the acoustic regime. The seed lasers allow for increased tunability, the capability to operate at one or more discrete wavelengths, and Fourier-transform limited operation at each discrete wavelength on each output pulse. Additionally, for applications where increased line width is desired, the seed laser can be adjusted to increase the slave oscillator line width. The use of a counter propagating ring cavity decreases the likelihood of mode competition due to the traveling waves in opposite directions, and the ring design prevents spatial hole burning.

In certain embodiments, a system for generating multiple simultaneous laser wavelengths is provided wherein said system comprises a pulsed slave laser comprising a non-linear electro-optic crystal optically coupled to a lasing crystal in a ring cavity configuration, said non-linear electro-optic crystal configured to adjust an optical path length of said ring cavity in response to an applied voltage potential; an energy pump configured to initiate a pulse cycle in said pulsed slave laser in response to a trigger; a cavity control circuit configured to apply said voltage potential to said non-linear electro-optic crystal to generate a cavity resonance condition associated with said adjusted optical path length, said cavity control circuit further configured to provide said trigger to said energy pump in response to a detection of said cavity resonance condition; and one or more seed lasers configured to inject a single frequency laser beam into said pulsed slave laser, wherein said pulsed slave laser preferentially amplifies said single frequency laser beam in response to said cavity resonance condition matching a resonance condition of said seed laser.

In certain embodiments, a method for generating multiple simultaneous laser wavelengths is provided, wherein said method comprises configuring a non-linear electro-optic crystal to adjust an optical path length of a pulsed slave laser, said pulsed slave laser comprising a lasing crystal coupled to said non-linear electro-optic crystal in a ring cavity configuration; applying a voltage potential to said non-linear electro-optic crystal to generate a cavity resonance condition associated with said adjusted optical path length; generating a trigger to an energy pump in response to detecting said cavity resonance condition, said energy pump configured to initiate a pulse cycle in said pulsed slave laser in response to said trigger; injecting one or more single frequency laser beams into said pulsed slave laser; and amplifying said single frequency laser beams in response to said cavity resonance condition matching a resonance condition of a seed laser associated with said single frequency laser beam.

DETAILED DESCRIPTION

Figure 1:
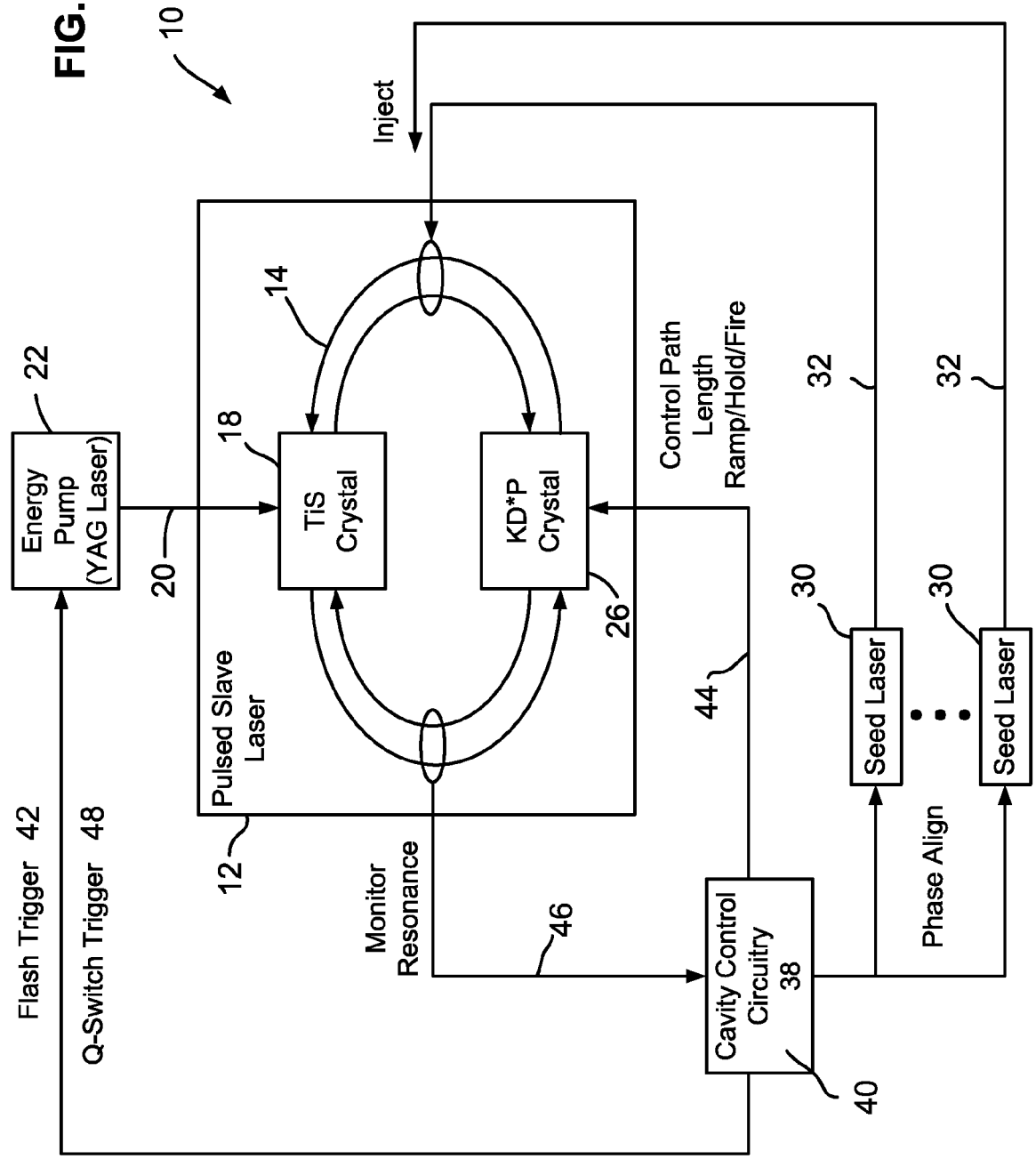
FIG. 1 is a top-level system block diagram illustrating the operation of an embodiment of the present disclosure.

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

Generally, this disclosure in preferred embodiment provides an injection-seeded Ti:Sapphire (TiS) ring laser with the capability to utilize both co- and counter-propagating seed beams with active cavity control to improve noise immunity. The seed lasers allow for increased tunability, the capability to operate at one or more discrete wavelengths, and Fourier-transform limited operation at each discrete wavelength on each output pulse, as will be explained in greater detail below.

FIG. 1 is a top-level system block diagram illustrating the operating system 10 and operation of a preferred embodiment of the present disclosure. A pulsed slave laser 12 is shown in a ring configuration 14 with a preferred TiS lasing crystal 18. Other crystals suitable for this purpose may include Nd:YAG, Alexandrite, Er:YAG, Yb:YAG and other common bulk solid state laser crystals. The TiS crystal 18 is pumped with energy 20 from an associated energy pump 22, which may be a neodymium doped yttrium aluminum garnet (Nd:YAG) laser or other suitable energy source such as, for example, a flash lamp.

The optical ring path 14 is channeled through a non-linear electro-optic crystal 26, which has the capability to alter the optical path length in response to an applied voltage. The electro-optic crystal 26 is preferably a potassium dihydrogen phosphate (KD*P) crystal. Other crystals suitable for this purpose may include KTA and other crystals with non-linear coefficients suitable for inducing phase changes in light for the desired operating wavelength range.

One or more seed lasers 30, which may be external cavity diode lasers (ECDL), provide a constant wave (CW) narrow frequency line width 32 that is injected into the pulsed slave laser 12, as will be described in greater detail below. Cavity control circuitry 38 of cavity control electronics 40 generates a flash trigger 42 for the energy pump 22 to which initiates a pulse cycle. The cavity control circuit 38 also applies a ramped voltage 44 to the electro-optic crystal 26 and monitors 46 the pulsed slave laser 12 to detect a resonance condition. When the resonance condition is detected, the voltage 44 is held for period of time and then a Q-switch trigger 48 is sent to the energy pump 22 to cause the pulsed slave laser 12 to pulse.

Generally, this disclosure in preferred embodiment provides a system and method capable of generating tunable laser output in the fundamental wavelength (as opposed to harmonic wavelengths) of the laser, preferably within the Near Infrared wavelength range of the spectrum. The system may also be capable of generating spectral coverage in a wavelength range of preferably 190 nm to 6 um with the use of intra- or extra-cavity non-linear frequency conversion components. The system may also be capable of generating multiple, simultaneous, single wavelength, injection-seeded, Fourier transform limited output.

Injection-seeding preferably employs a stable, CW narrow frequency line width seed laser 30, also known as the master oscillator. Light, in the form of CW narrow frequency line width beam 32, from the seed laser/master oscillator 30 is injected into the cavity of a high-energy pulsed slave laser 22, commonly referred to as the slave oscillator. If injection-seeding were not employed, the slave cavity would build up the laser pulse from the laser medium emission cross-section coupled with the cavity eigenmodes, leading to a relatively large line width and, typically, a multi-mode operation.

The use of injection-seeding, however, causes the seed light/beam 32 present in the slave cavity to be preferentially amplified and quickly dominate the laser amplification. This results in a relatively narrow frequency line width, operation. The seed light/beam 32 will dominate the buildup provided that the radiation from the seed laser 30 is large compared to that of the spontaneous emission at that particular frequency. The stimulated emission resulting from the seed light/beam 32 builds up before other modes from spontaneous emission, thus limiting the energy built up from spontaneous emission to a small fraction of that from the stimulated emission.

A constraint associated with injection seeding is that the oscillator cavity of the slave laser 22 be in resonance with the master oscillator/seed laser 30. Resonance with the master oscillator/seed laser 30 is preferably achieved by adjusting the optical path length of the slave oscillator cavity to match the resonance of the master oscillator/seed laser 30. The temporal jitter, with respect to the optical pump, is significantly reduced because the buildup occurs primarily from the simulated emission due to the photon density present in the slave oscillator cavity from the master oscillator/seed laser 30. Injection-seeding enables the generation of Fourier transform limited laser pulses in the nanosecond range.

As noted above, injection seeding of a pulsed laser 22 is most efficient when the cavity is resonant with respect to the seed light/beam 32 during the buildup time of the laser pulse. A ramp-hold-fire (RHF) technique may be used to lock the cavity length at the optimal point to achieve this purpose. The RHF technique typically involves applying a voltage ramp 44 to a piezoelectric crystal 26 behind a cavity mirror to change the length of the cavity. As the voltage ramp 44 is applied, the intensity of the seed light/beam 32 inside the cavity is monitored and when a resonance peak is detected, the voltage ramp 44 is stopped and held for several hundred microseconds. The slave laser 22 can then be fired anytime during the hold time. This method provides increased immunity to acoustic noise with periods that are longer than the hold time, and allows for the synchronization of the slave laser 22 to other systems.

The RHF technique as described, however, does have some limitations. Because the piezoelectric crystal 26 is mechanically moving a relatively massive mirror, the ramp time generally needs to be relatively long to avoid excessive ringing. With a long ramp time, acoustical noise immunity is then limited and complex electronics may be needed to dampen any ringing from the piezoelectric crystal 26. A settling time is also generally required after the resonant hold condition is detected. An alternate method of phase modulation, however, may be employed to induce a change in the optical path length of the cavity permitting the replacement of electromechanical components and thereby eliminating the need for any damping electronics. By utilizing a non-linear crystal 26, such as the KD*P, to change the optical path length of the cavity, mechanical ringing may be avoided and the ramp time is significantly decreased improving the noise immunity of the system.

Figure 2:
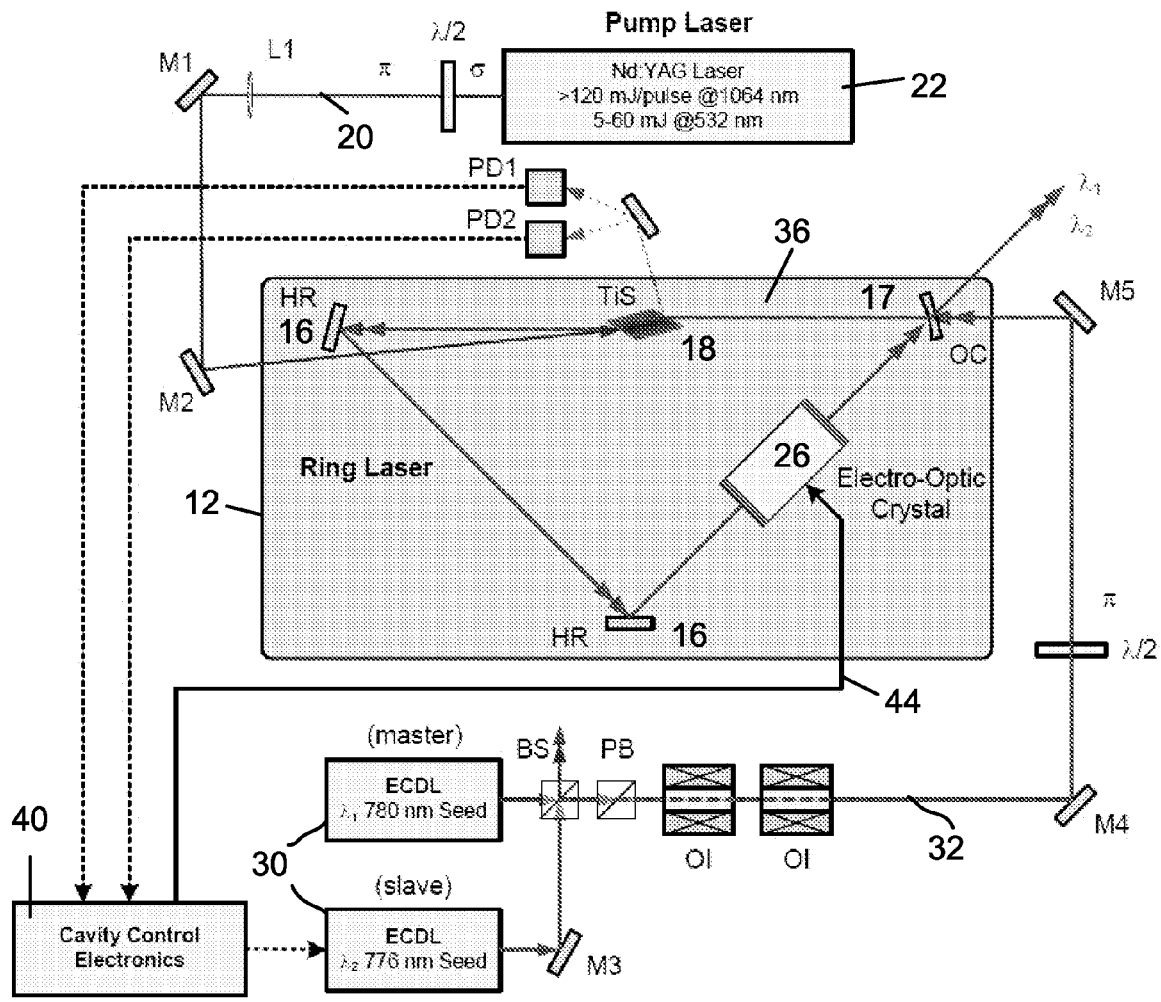
FIG. 2 is a schematic diagram of an embodiment of the present disclosure.
Figure 2A:
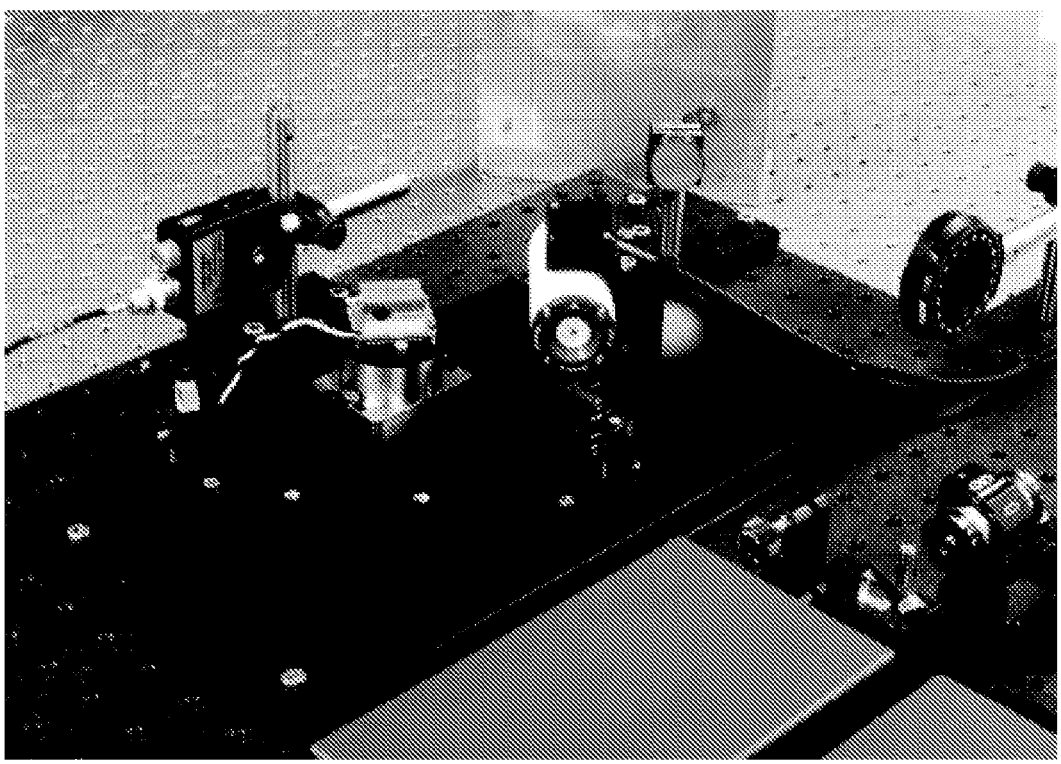
FIG. 2A is a first photograph of the embodiment of FIG. 2.
Figure 2B:
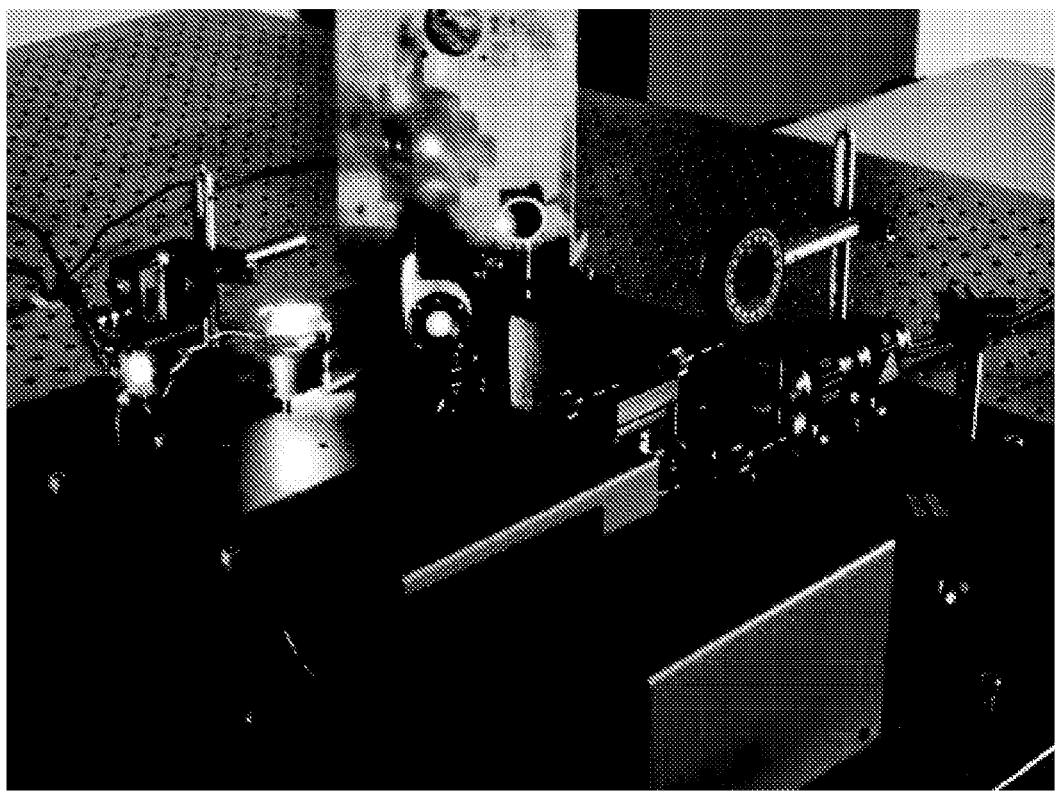
FIG. 2B is a second photograph of the embodiment of FIG. 2.

A schematic diagram of a preferred injection-seeded dual wavelength pulsed laser 12 with an active electro-optical cavity control system in accordance with one embodiment of the present disclosure is illustrated in FIG. 2. The basic ring cavity design may consist of only five components: two High Reflectivity (HR) mirrors 16, an Output Coupler (OC) mirror 17, a Ti:Sapphire crystal (TiS) 18, and a KD*P electro-optic crystal 26. The cavity control electronics 40, provide a High Voltage (HV) potential 44 to the KD*P electro-optic crystal 26, to find and maintain the cavity resonance condition. Two narrow frequency line-width external seed lasers 30 provide seed light 32 into the slave cavity, which is then amplified and coupled out via the OC mirror 17.

The laser 12 is optically pumped, preferably at 532 nm, by a frequency doubled Q-Switched Nd:YAG laser 22. Preferably, up to 60 mJ per pulse, of pump energy 20 is incident on the TiS crystal 18, although higher energies, of up to and exceeding 90 mJ, are possible. The upper limit on per pulse pump energy 20 is set by the damage threshold for optical components in the laser cavity 36. Q-switched operation typically provides pump duration between 5 ns-10 ns. The pump beam may be steered into the crystal using a set of mirrors, M1 and M2, and focused approximately 4 cm in front of the TiS crystal 18 using a long focal length lens 38, greater than 50 cm, to avoid optical damage. The pump beam eigenmode overlaps the eigenmodes of the two seed lasers 30.

The triangular ring cavity design is the least complex for developing a traveling wave oscillator, and provides an additional benefit of simple construction, straightforward alignment, and maintainability. The cavity 36 may utilize either a Brewster prism, which provides additional cavity dispersion, or an HR mirror 16. The HR mirror 16 may be used for dual wavelength operation when the two seeded wavelengths are separated by more than 5 nm. The HR mirrors 16 are preferably greater than 99% reflective at 780 nm and 776 nm. In addition, the coatings may be selected for peak reflectivity at 45° for the apex mirror and 22.5° for the base mirrors. The OC mirror 17 preferably has a radius of curvature between 2 m and 10 m and a reflectivity of between 50% and 80%. The OC mirror 17 preferably has a radius of 3 m and a reflectivity of 70%.

The TiS crystal 18 preferably has have an absorption coefficient, a, of 2.5 cm$^{-1}$ at 532 nm, which corresponds to a Ti$^{3+}$ ion concentration of 0.15 wt. %. This selection is made to maximize absorption of the pump light 20, 99.33%, over the length of the crystal 18 while increasing the gain. While a Figure of Merit greater than 250 may be needed to reduce parasitic losses, a FOM of 350 or more is common. The crystal 18 may be Brewster cut, preferably with a length of 20 cm and a diameter, φ, of 0.62 cm, which is a standard cut and size. An analysis may determine what, if any, thermal dissipation is needed to ensure the crystal 18 is not damaged due to thermal loading. A Thermo Electric Cooler (TEC) may be utilized in the design to provide cooling and thermal stability of the TiS laser crystal 18.

Figure 3:
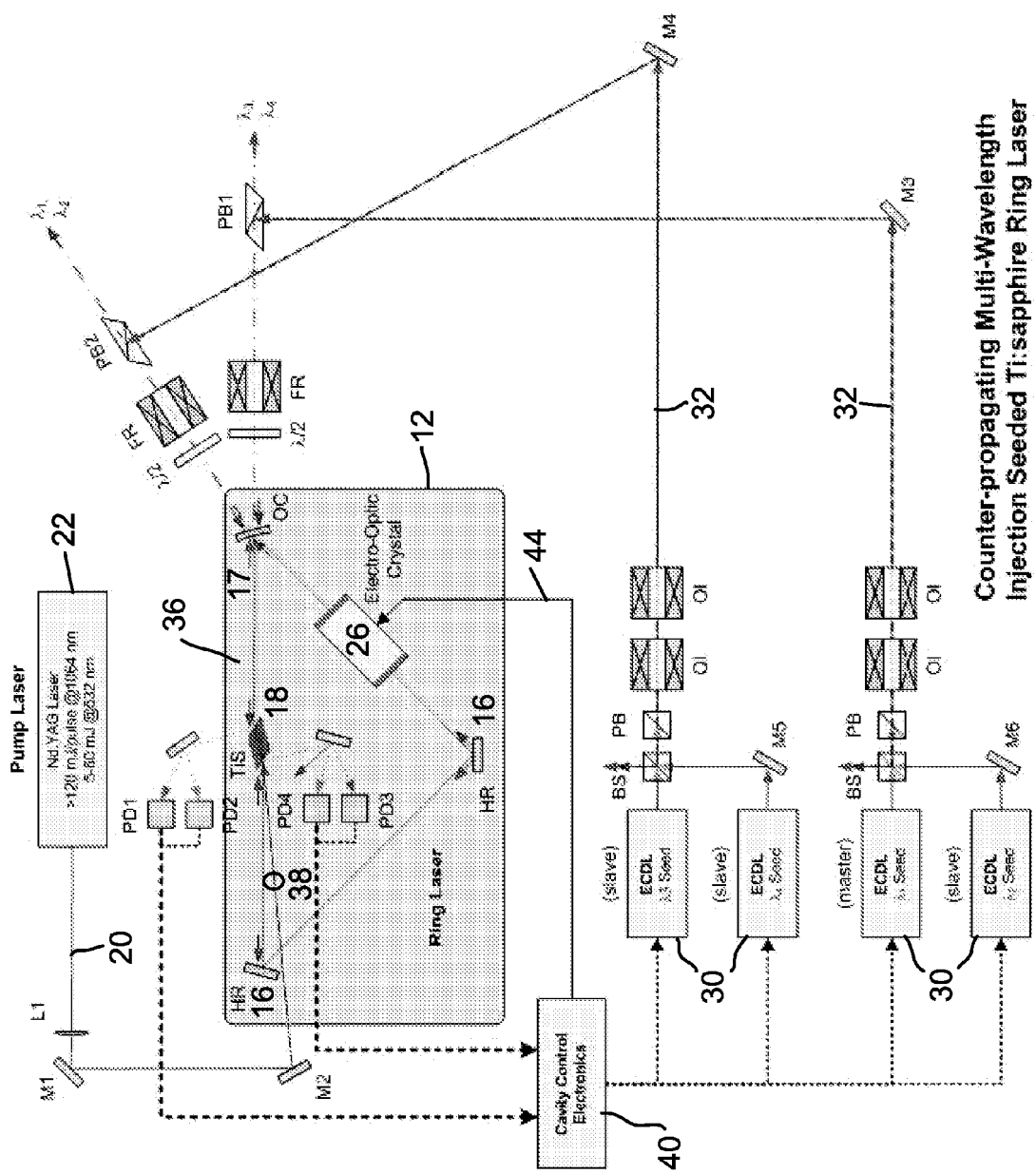
FIG. 3 is a schematic diagram of another embodiment of the present disclosure.

FIG. 3 is a schematic diagram of another preferred embodiment of the present disclosure. In this embodiment, four seed lasers 30 are employed to generate four simultaneous seed wavelengths 32. Two of the seed beams 32 are injected into the slave ring in a co-propagating direction as previously described while the other two seed beams 32 are injected in a counter-propagating direction. Use of a counter-propagating beam 32 facilitates spatial separation of the beam outputs from the laser ring and also reduces the risk of cross coupling between the beams 32, which may be particularly advantageous at higher power levels.

The KD*P non-linear crystal 26 is used in the ring design to modulate the optical phase of the seed beams propagating within the cavity 36. The use of a non-linear crystal 26 for this purpose is novel. Typically, KD*P crystals 26 are used to change the polarization of light based on the Pockels effect. As an electric field is applied across the non-linear material, a phase shift is induced proportional to the field and this effect, coupled with wave plates, can be used to rotate the polarization of light passing through the crystal 26. Embodiments of the present disclosure, however, use the KD*P crystal 26 to induce a change in phase without changing the polarization of the light. The change in optical path length, ΔL, as a function of the electric potential, U, is given by the relation, $$U = k\frac{\Delta L}{l}; k = \frac{2d}{n_o^3 r_{63}}$$

where l is the length of the non-linear crystal, d is the height, $n_o$ is the ordinary refractive index, and $r_{63}$ is the electro-optic coefficient of the material. In some embodiments, preferable values for these parameters may include l=35 mm, d=4 mm, $n_o$=1.503 at 780 nm, and $r_{63}$=26.4×10-12 m/V. In order to ensure that at least one resonant peak will occur, the dynamic range may be at least equal to the Free Spectral Range (FSR) (i.e., the frequency spacing between resonator modes). Preferably, the dynamic range would be selected to be 1.5 times the FSR range to ensure detection of the resonance peaks. However, the voltage required to induce a sufficient phase change at 780 nm is approximately 2 kV. The length of the non-linear crystal and electric potential may then be optimized for this system.

Figure 4:
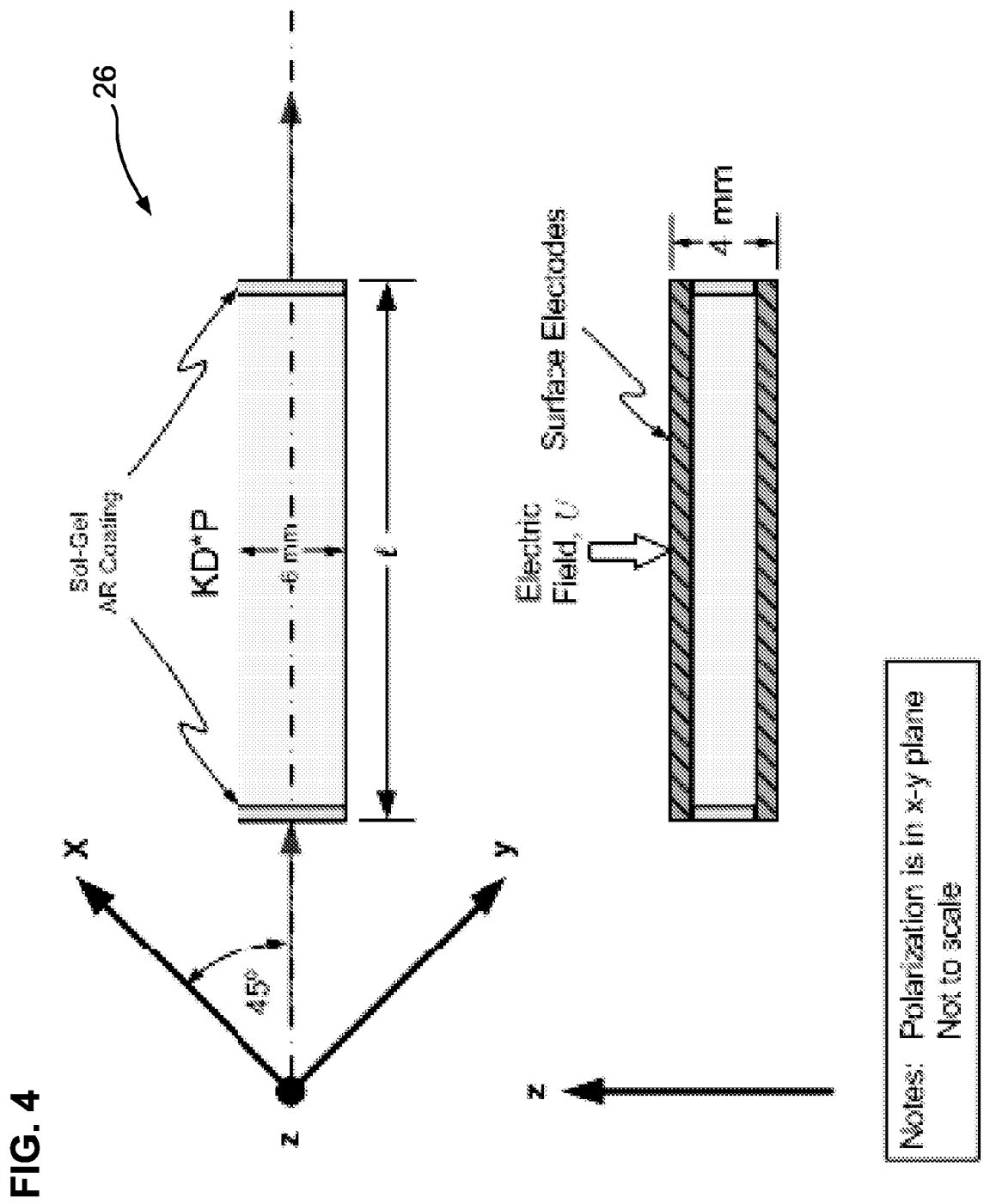
FIG. 4 is an illustration of the KD*P crystal in accordance with an embodiment of the present disclosure.

The KD*P crystal 26 may be a custom crystal, cut as illustrated in FIG. 4. The polarization is in the x-y plane such that the polarization of the light is parallel to one of the field-induced axes of the crystal 26. Therefore, the applied field will effect only a phase change in the light without modifying its polarization state. The response of the KD*P crystal 26 is on the nanosecond time scale which is faster than required for this application.

Figure 5:
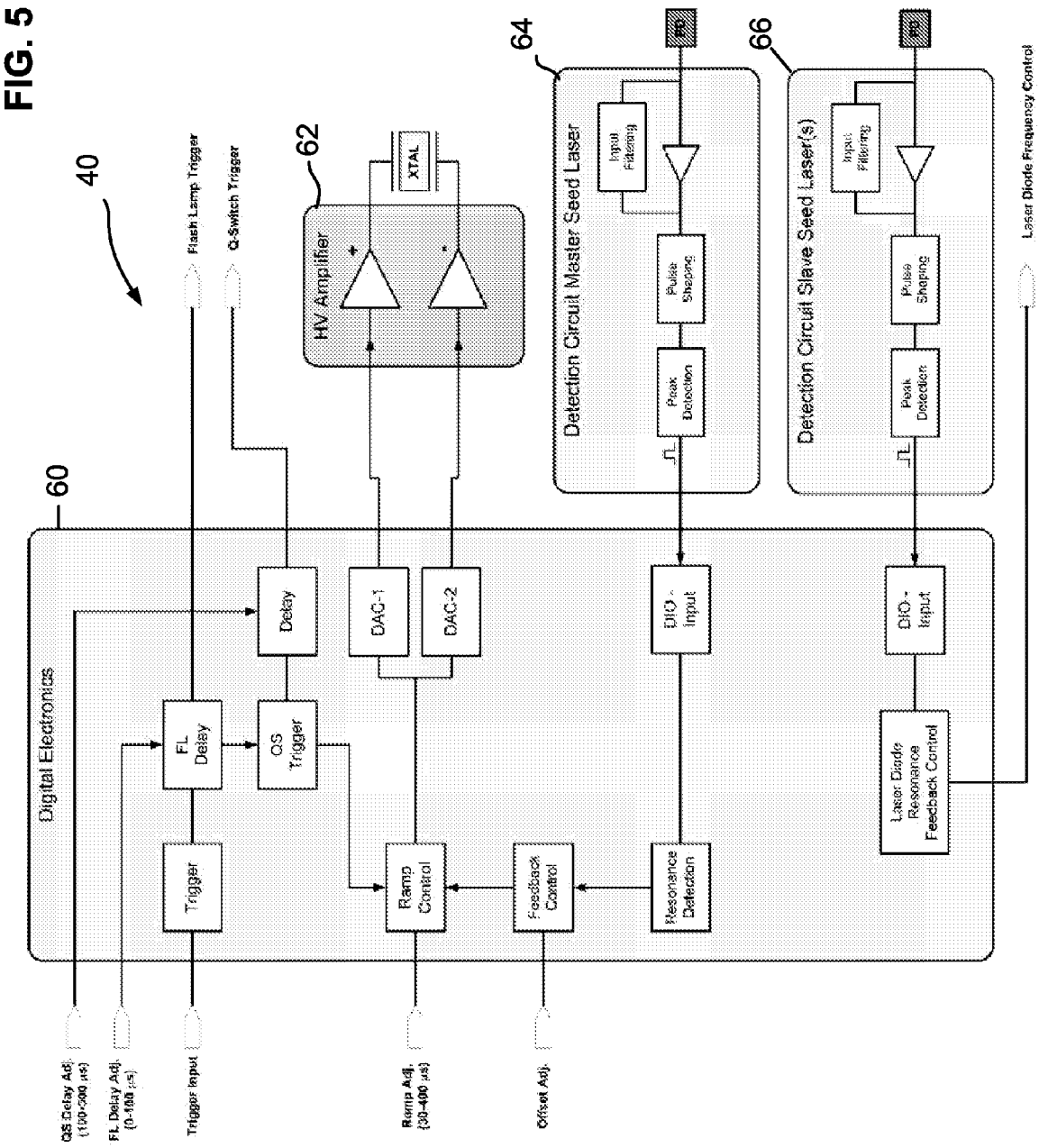
FIG. 5 is a block diagram of the cavity control circuit in accordance with an embodiment of the present disclosure.

The cavity control electronics 40, illustrated in FIG. 5, consists of four main sections: the digital electronics 60, the HV amplifier 62, and the detection circuits 64, 66 for the master seed laser and the slave seed laser. The digital electronics 40 generates the ramp and hold, which is output through a Digital to Analog (D/A) converter as a differential low voltage signal. The ramp control may have an adjustment to vary the hold time, preferably from 30 µs to 250 µs. The ramp is initiated via an input TTL trigger input and an adjustable delay circuit, which triggers the pump laser Q-switch a fixed time later. The Q-switch delay may be no less than the full ramp period, preferably 30 µs. In this way, the laser can be synchronized with other systems.

The detection circuits 64, 66 for the master seed laser and the slave seed lasers preferably have two inputs from two independent photodiodes. The photo-detection circuit consists of a biased high speed PIN photo-diode, preferably with a rise time of 1 ns or less. The output from the photo-diode is then amplified through a transimpedance amplifier and buffered to the pulse shaping electronics. The pulse shaping circuit filters and squares the input signal to obtain a clean sharp peak. Following the pulse shaping circuit, the resonance detection circuit generates the derivative of the signal and compares that to a zero reference, thereby identifying the resonance peak. Once the peak, or resonance condition is found from the master seed laser detection circuit, a TTL-level pulse is generated and sent to the digital electronics 60 to stop and hold the ramp at the current voltage. The feedback circuit may incorporate an offset adjustment to account for the time delay in the hold detection. The offset takes into account the ramp slew rate and adjusts the voltage to account for the hold time delay. Specifically, the hold voltage is reduced by the product of the ramp slew rate and the hold delay time. In addition, the feedback circuit may be used to make rapid fine adjustments to account for noise or drift based on the initial reference signal obtained at the resonance detection. The electronics 60 can then track the cavity, making small high-speed adjustments, to maintain the resonance condition.

The crystal 26 preferably has a capacitance of approximately 25 pf. A slew rate of preferably 67 V/μs is desired. Although a large signal bandwidth of 15 to 20 kHz is desired, it is reasonable to have a relatively small signal bandwidth of 15 to 20 kHz with a large signal bandwidth of approximately half this value. For a 50 mm non-linear crystal 26, the maximum potential difference would be approximately 2 kV. This value may be reduced if a longer crystal 26 is used. The cavity requirements imply that the HV amplifier 62 should transition from the ramp to the hold within 25 V and within 2.5 μs and have a hold stability of better than ±5 V over 250 μs. The HV amplifier 26 provides a differential output across the electro-optic crystal 26.

The voltage ramp across the electro-optic crystal 26 is utilized to find the resonance of the master seed laser and hold that voltage. The light from the other seed laser(s) are each monitored by using a reflective grating, or other dispersive optic such as a prism or transmission grating, and a high speed photodetector. The grating separates the light from each seed laser allowing each discrete wavelength to be independently monitored. Once the resonance condition for the master seed laser has been detected and the hold signal generated, the slave lasers are slightly detuned, through the laser diode resonance feedback control block, to bring each of the slave seed lasers into simultaneous resonance (i.e., phase matched) with the amplifier cavity. This de-tuning may be accomplished by changing the tuning grating angle, or more commonly by changing the laser diode injection current. Once the seed lasers 30 are in resonance with the amplifier cavity, the pulsed laser 22 can be fired resulting in Fourier-transform limited laser output at each discrete wavelength on every output pulse. In addition, if the pump laser 22 is fired within 30 μs of the hold signal, the pulsed-laser output will be immune to noise throughout the acoustic range because the cavity cannot respond, mechanically, to vibrations within this time frame. The seed lasers 30 may be re-tuned on each subsequent pulse to provide continuous dynamic tuning of the laser output.

Figure 6:
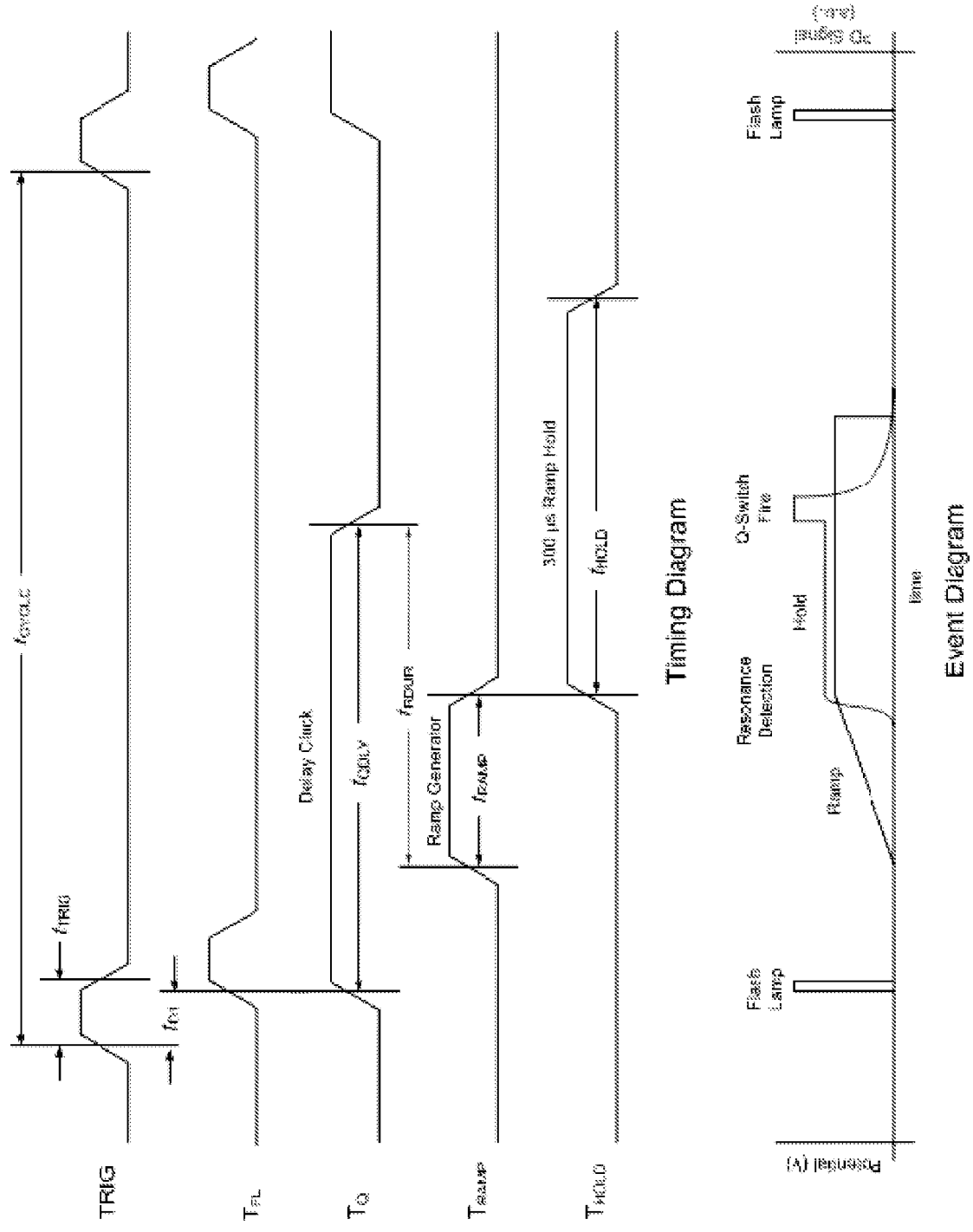
FIG. 6 is a timing diagram in accordance with an embodiment of the present disclosure.

FIG. 6 is a timing diagram in accordance with another preferred embodiment of the present disclosure. The timing illustrates the relationship between the sequence of events involved in the firing of a pulse. The diagram is not drawn to scale. An initial trigger signal begins the pulse cycle and at a time $t_{D1}$ later the energy pump (or flash lamp) delivers energy to the slave ring laser. The ramp generator subsequently begins to increase the voltage to the KD*P crystal 26 until a resonance is detected, at which point the voltage is held. In this example the hold time is 300 us. At a time $t_{QDLY}$ beyond the flash lamp trigger 42, and before the voltage hold time expires, the Q-switch trigger 48 is sent to the energy pump to initiate the pulse fire in the slave ring laser.

In accordance with the above disclosure, the present invention may therefore relate to one or more of the following system or process characteristics, which may be present alone or in any combination:

A system capable of generating multiple, simultaneous, single wavelength, injection-seeded, Fourier transform limited output by applying a voltage to a KD*P electro-optic crystal (crystals with non-linear coefficients suitable for inducing phase changes in light for the desired operating wavelength range) to increase immunity to acoustic noise.

A system capable of generating multiple, simultaneous, single wavelength, injection-seeded, Fourier transform limited output by applying a voltage to a KD*P electro-optic crystal (crystals with non-linear coefficients suitable for inducing phase changes in light for the desired operating wavelength range) in a ramp-hold-fire technique.

A system capable of generating multiple, simultaneous, single wavelength, injection-seeded, Fourier transform limited output by applying a voltage to a KD*P electro-optic crystal (crystals with non-linear coefficients suitable for inducing phase changes in light for the desired operating wavelength range) with any of a ramp-fire technique, a pulse build-up minimization technique, or a dither-lock technique.

A system capable of generating multiple, simultaneous, single wavelength, injection-seeded, Fourier transform limited output by co-propagating and/or counter-propagating the injection-seeded laser in a slave ring laser.

A system capable of generating multiple, simultaneous, single wavelength, injection-seeded, Fourier transform limited output by counter-propagating the injection-seeded laser in a slave ring laser wherein the counter-propagating is accomplished with a polarization based coupling to isolate the seed laser system from the slave ring laser output.

A system capable of generating multiple, simultaneous, single wavelength, injection-seeded, Fourier transform limited output using free space optics and/or optical fiber.

A process for generating multiple, simultaneous, single wavelength, injection-seeded, Fourier transform limited output by applying a voltage to a KD*P electro-optic crystal (crystals with non-linear coefficients suitable for inducing phase changes in light for the desired operating wavelength range) to increase immunity to acoustic noise.

A process for generating multiple, simultaneous, single wavelength, injection-seeded, Fourier transform limited output by applying a voltage to a KD*P electro-optic crystal (crystals with non-linear coefficients suitable for inducing phase changes in light for the desired operating wavelength range) in a ramp-hold-fire technique.

A process for generating multiple, simultaneous, single wavelength, injection-seeded, Fourier transform limited output by applying a voltage to a KD*P electro-optic crystal (crystals with non-linear coefficients suitable for inducing phase changes in light for the desired operating wavelength range) with any of a ramp-fire technique, a pulse build-up minimization technique, or a dither-lock technique.

A process for generating multiple, simultaneous, single wavelength, injection-seeded, Fourier transform limited output by co-propagating and/or counter-propagating the injection-seeded laser in a slave ring laser.

A process for generating multiple, simultaneous, single wavelength, injection-seeded, Fourier transform limited output by counter-propagating the injection-seeded laser in a slave ring laser wherein the counter-propagating is accomplished with a polarization based coupling to isolate the seed laser system from the slave ring laser output.

A process for generating multiple, simultaneous, single wavelength, injection-seeded, Fourier transform limited output using free space optics and/or optical fiber.

While a preferred embodiment of the present invention(s) has been described, it should be understood that various changes, adaptations and modifications can be made therein without departing from the spirit of the invention(s) and the scope of the appended claims. The scope of the invention(s) should, therefore, be determined not with reference to the above description, but instead should be determined with reference to the appended claims along with their full scope of equivalents. Furthermore, it should be understood that the appended claims do not necessarily comprise the broadest scope of the invention(s) which the applicant is entitled to claim, or the only manner(s) in which the invention(s) may be claimed, or that all recited features are necessary.

What is claimed is:

1. A system for generating multiple simultaneous laser wavelengths, said system comprising:
a pulsed slave laser comprising a non-linear electro-optic crystal optically coupled to a lasing crystal in a ring cavity configuration, said non-linear electro-optic crystal configured to adjust an optical path length of said ring cavity in response to an applied voltage potential;
an energy pump configured to initiate a pulse cycle in said pulsed slave laser in response to a flash trigger;
a master seed laser configured to inject a first single frequency laser beam into said pulsed slave laser;
a slave seed laser configured to inject a second single frequency laser beam into said pulsed slave laser; and
a cavity control circuit configured to:
apply said voltage potential to said non-linear electro-optic crystal;
ramp said voltage potential from an initial voltage to a final voltage, said final voltage associated with detection of a cavity resonance condition associated with said adjusted optical path length, said cavity resonance condition matching a resonance condition of said master seed laser;
maintain said voltage potential at said final voltage for a pre-determined hold-time period;
de-tune said slave seed laser, during said hold-time period, such that said slave seed laser matches said cavity resonance condition; and
provide a Q-switch trigger to said energy pump within 30 microseconds of the start of said hold-time period.

2. The system of claim 1, wherein said master seed laser and one or more of said slave seed lasers are associated with one of said multiple simultaneous laser wavelengths.

3. The system of claim 1, wherein said master seed laser beam is injected into said pulsed slave laser in a co-propagating direction relative to said slave seed laser beam.

4. The system of claim 1, wherein said master seed laser beam is injected into said pulsed slave laser in a counter-propagating direction relative to said slave seed laser beam.

5. The system of claim 1, wherein said non-linear electro-optic crystal is a potassium dihydrogen phosphate (KD*P) crystal and said lasing crystal is a titanium sapphire (TiS) crystal.

6. The system of claim 1, wherein said lasing crystal is selected from the group consisting of a neodymium doped yttrium aluminum garnet (Nd:YAG) crystal, an alexandrite crystal, an erbium doped yttrium aluminum garnet (Er:YAG) crystal and a ytterbium doped yttrium aluminum garnet (Yb:YAG) crystal.

7. The system of claim 1, wherein said energy pump is selected from the group consisting of an ND:YAG laser and a flash lamp.

8. The system of claim 1, wherein said seed laser is an external cavity diode laser.

9. The system of claim 1, wherein the fundamental frequency of said multiple simultaneous laser wavelengths is within the near infrared wavelength range of the spectrum.

10. The system of claim 1, wherein said hold-time period is in the range of 30 microseconds to 250 microseconds.

11. A method for generating multiple simultaneous laser wavelengths, said method comprising:
configuring a non-linear electro-optic crystal to adjust an optical path length of a pulsed slave laser in response to an applied voltage potential, said pulsed slave laser comprising a lasing crystal coupled to said non-linear electro-optic crystal in a ring cavity configuration;
providing a flash trigger to an energy pump to initiate a pulse cycle in said pulsed slave laser;
injecting a first single frequency laser beam from a master seed laser into said pulsed slave laser;
injecting a second single frequency laser beam from a slave seed laser into said pulsed slave laser;
ramping said voltage potential from an initial voltage to a final voltage, said final voltage associated with detection of a cavity resonance condition associated with said adjusted optical path length, said cavity resonance condition matching a resonance condition of said master seed laser;
maintaining said voltage potential at said final voltage for a pre-determined hold-time period;
de-tuning said slave seed laser, during said hold-time period, such that said slave seed laser matches said cavity resonance condition; and
providing a Q-switch trigger to said energy pump within 30 microseconds of the start of said hold-time period.

12. The method of claim 11, wherein said master seed laser and one or more of said slave seed lasers are associated with one of said multiple simultaneous laser wavelengths.

13. The method of claim 11, further comprising injecting said master seed laser beam into said pulsed slave laser in a co-propagating direction relative to said slave seed laser beam.

14. The method of claim 11, further comprising injecting said master seed laser beam into said pulsed slave laser in a counter-propagating direction relative to said slave seed laser beam.

15. The method of claim 11, wherein said non-linear electro-optic crystal is a potassium dihydrogen phosphate (KD*P) crystal.

16. The method of claim 11, wherein the fundamental frequency of said multiple simultaneous laser wavelengths is within the near infrared wavelength range of the spectrum.

17. The method of claim 11, wherein said hold-time period is in the range of 30 microseconds to 250 microseconds.

* * * * *